United States Patent
Shin et al.

(10) Patent No.: US 8,329,554 B2
(45) Date of Patent: *Dec. 11, 2012

(54) ULTRA THIN BUMPED WAFER WITH UNDER-FILM

(75) Inventors: Junghoon Shin, Choongbook (KR);
Sangho Lee, Kyounggi (KR); Sungyoon Lee, Inchon-si (KR)

(73) Assignee: STATS ChipPac, Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 12/916,758

(22) Filed: Nov. 1, 2010

(65) Prior Publication Data

US 2011/0045637 A1 Feb. 24, 2011

Related U.S. Application Data

(63) Continuation of application No. 11/745,045, filed on May 7, 2007, now Pat. No. 7,838,391.

(51) Int. Cl.
*H01L 21/30* (2006.01)
*H01L 21/46* (2006.01)

(52) U.S. Cl. .............. 438/455; 438/459; 257/E21.088

(58) Field of Classification Search .............. 438/455, 438/458, 459, 464, 113, 114, 460; 257/E21.499, 257/E21.599, E21.088
See application file for complete search history.

(56) References Cited

U.S. PATENT DOCUMENTS

| | | | |
|---|---|---|---|
| 5,400,950 A | 3/1995 | Myers et al. | |
| 6,620,862 B2 | 9/2003 | Ueda et al. | |
| 6,787,921 B2 | 9/2004 | Huang | |
| 7,105,424 B2 | 9/2006 | Tsai et al. | |
| 7,413,927 B1 | 8/2008 | Patwardhan et al. | |
| 7,838,391 B2 * | 11/2010 | Shin et al. | 438/455 |
| 2002/0190224 A1 * | 12/2002 | Tazaki | 250/484.4 |
| 2004/0043901 A1 * | 3/2004 | Ono | 503/200 |
| 2005/0008873 A1 | 1/2005 | Noro et al. | |
| 2005/0142696 A1 | 6/2005 | Tsai | |
| 2005/0142837 A1 | 6/2005 | Tsai | |
| 2005/0221598 A1 * | 10/2005 | Lu et al. | 438/613 |

* cited by examiner

*Primary Examiner* — Phat X Cao
*Assistant Examiner* — Nga Doan
(74) *Attorney, Agent, or Firm* — Robert D. Atkins; Patent Law Group: Atkins & Associates, P.C.

(57) ABSTRACT

A method of making a semiconductor device includes forming an under-film layer over bumps disposed on a surface of a wafer to completely cover the bumps, and forming an adhesive layer over the under-film layer. The method further includes attaching a support layer over the adhesive layer, removing a portion of a back surface of the wafer, and removing the support layer to expose the adhesive layer that remains disposed over the under-film layer. The method further includes removing the adhesive layer to expose the under-film layer while the bumps remain completely covered by the under-film layer, and singulating the wafer to form a semiconductor die. The method further includes pressing the bumps into contact with a substrate while the under-film layer provides an underfill between the semiconductor die and the substrate.

17 Claims, 4 Drawing Sheets

ULTRA THIN BUMPED WAFER WITH UNDER-FILM

CLAIM TO DOMESTIC PRIORITY

The present application is a continuation of U.S. patent application Ser. No. 11/745,045, filed May 7, 2007, and claims priority to the foregoing parent application pursuant to 35 U.S.C. §120.

FIELD OF THE INVENTION

The present invention relates in general to electronic devices and, more particularly, to a method of forming a thin bumped wafer semiconductor device having an under-film material and utilizing a support structure during a back grinding process.

BACKGROUND OF THE INVENTION

Semiconductors, or computer chips, are found in virtually every electrical product manufactured today. Chips are used not only in very sophisticated industrial and commercial electronic equipment, but also in many household and consumer items such as televisions, clothes washers and dryers, radios, and telephones. As products become smaller but more functional, there is a need to include more chips in the smaller products to perform the functionality. The reduction in size of cellular telephones is one example of how more and more capabilities are incorporated into smaller and smaller electronic products.

A so-called "flip chip" is generally a monolithic semiconductor device, such as an integrated circuit, having bead-like terminals formed on one surface of the chip. The terminals serve to both secure the chip to a circuit board and electrically connect the flip chip's circuitry to a conductor pattern formed on the circuit board, which may be a ceramic substrate, printed wiring board, flexible circuit, or a silicon substrate. Due to the numerous functions typically performed by the microcircuitry of a flip chip, a relatively large number of terminals are required.

Because of the fine patterns of the terminals and conductor pattern, soldering a flip chip to its conductor pattern requires a significant degree of precision. Reflow solder techniques are widely utilized in the soldering of flip chips. Such techniques typically involve forming solder bumps on the surface of the flip chip using methods such as electrodeposition, by which a quantity of solder is accurately deposited on one surface of the flip chip. Heating the solder above its melting temperature serves to form the characteristic solder bumps. The chip is then soldered to the conductor pattern by registering the solder bumps with their respective conductors, and reheating, or reflowing, the solder so as to metallurgically and electrically bond the chip to the conductor pattern.

In flip chip packaging and other semiconductor devices, a so-called "underfill" material is provided between the substrate and the die to promote device reliability characteristics. Various methods are known in the art for depositing the underfill material, including deposition through an opening of the substrate so as to fill in a gap between the substrate and the die. More recently, techniques involving the application of a film to the bumped wafer have been utilized.

Shortcomings associated with the current art remain. For example, removal of a film material from the bumped wafer can cause damage to the characteristic solder bumps. In addition, the prior art shows a two-step process of attaching a chip to the substrate, in which case, providing the underfill material results in an extra manufacturing step and the expenditure of excess resources.

SUMMARY OF THE INVENTION

A need exists for an apparatus, method and system which more effectively and precisely controls the underfill application process. In addition, a need exists for an apparatus, method and system which results in a thinner bumped wafer structure, which is increasingly in demand for certain applications.

Accordingly, in one embodiment, the present invention is a method of forming a semiconductor device that includes providing a wafer having a plurality of bumps formed on a surface of the wafer, and forming an under-film layer over the bumps formed on the surface of the wafer to completely cover all portions of the bumps with the under-film layer. After forming the under-film layer, an adhesive layer is formed over the under-film layer. After forming the adhesive layer, a support layer is attached over the adhesive layer. The method further includes grinding a back surface of the wafer, and the support layer provides structural support to the wafer during the grinding process. Following the grinding process, a dicing saw tape is laminated to the back surface of the wafer. The method further includes removing the support layer to expose the adhesive layer, which remains disposed over the under-film layer, and removing the adhesive layer to expose the under-film layer. All portions of the bumps remain completely covered by the under-film layer after removing the adhesive layer.

In another embodiment, the present invention is a method of making a semiconductor device that includes forming an under-film layer over bumps formed on a surface of a wafer to completely cover all portions of the bumps with the under-film layer. After forming the under-film layer, an adhesive layer is formed over the under-film layer. After forming the adhesive layer, a support layer containing glass, acryl board, or wafer material is attached over the adhesive layer. The method further includes removing a portion of a back surface of the wafer, and removing the support layer to expose the adhesive layer. After removing the support layer, the adhesive layer is removed to expose the under-film layer while all portions of the bumps remain completely covered by the under-film layer after removing the adhesive layer. The method further includes singulating the wafer to form a semiconductor die, and using the under-film layer as an underfill between the semiconductor die and a substrate when mounting the semiconductor die to the substrate.

In still another embodiment, the present invention is a method of making a semiconductor device that includes forming an under-film layer over bumps disposed on a surface of a wafer to completely cover the bumps, and forming an adhesive layer over the under-film layer. The method further includes attaching a support layer over the adhesive layer, removing a portion of a back surface of the wafer, and removing the support layer to expose the adhesive layer which remains disposed over the under-film layer. The method further includes removing the adhesive layer to expose the under-film layer while the bumps remain completely covered by the under-film layer, and singulating the wafer to form a semiconductor die. The method further includes pressing the bumps into contact with a substrate while the under-film layer provides an underfill between the semiconductor die and the substrate.

In yet another embodiment, the present invention is a method of making a semiconductor device that includes forming an under-film layer over a plurality of bumps formed on a surface of a wafer, forming an adhesive layer over the under-film layer, and removing the adhesive layer to expose the under-film layer. The method further includes singulating the wafer to form a semiconductor die, and applying force to a back surface of the semiconductor die to press the bumps into contact with a substrate while the under-film layer provides an underfill between the semiconductor die and the substrate.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Figure 1:
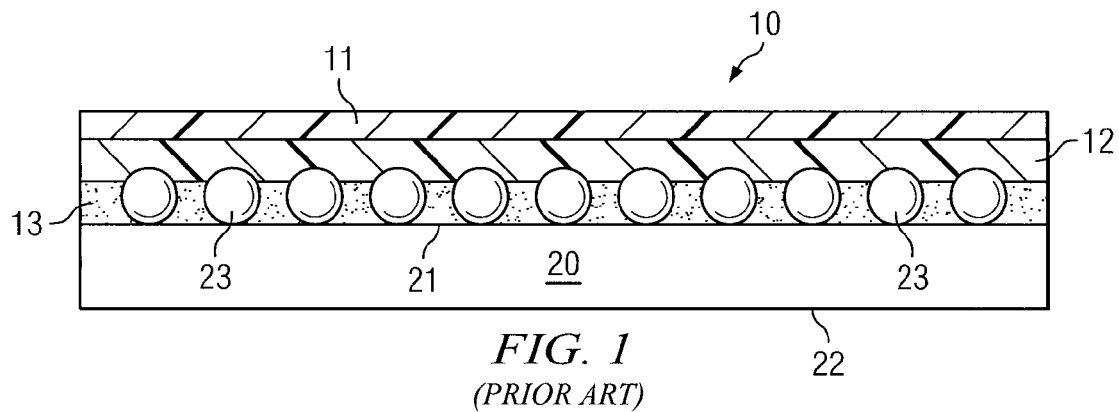
FIG. 1 illustrates an exemplary prior art method for providing an underfill material over a bumped wafer structure.

FIG. 1 illustrates an exemplary prior art method of providing an underfill material over a bumped wafer structure. A film 10 includes layers 11 and 12 which are disposed over an underfill layer 13. A bumped wafer 20 has an active surface 21 and a back surface 22 including a plurality of bumps 23. A roller is used to press film 10 onto the bumped wafer 20 under heating so as to have bumps 23 embedded in the underfill layer 13. The back surface 22 is faced to a grinding tool to thin the thickness of the wafer 20 by grinding the back surface 22 of the wafer 20. The step of grinding the back surface 22 of the wafer occurs following the removal of a heating device.

Figure 2A:
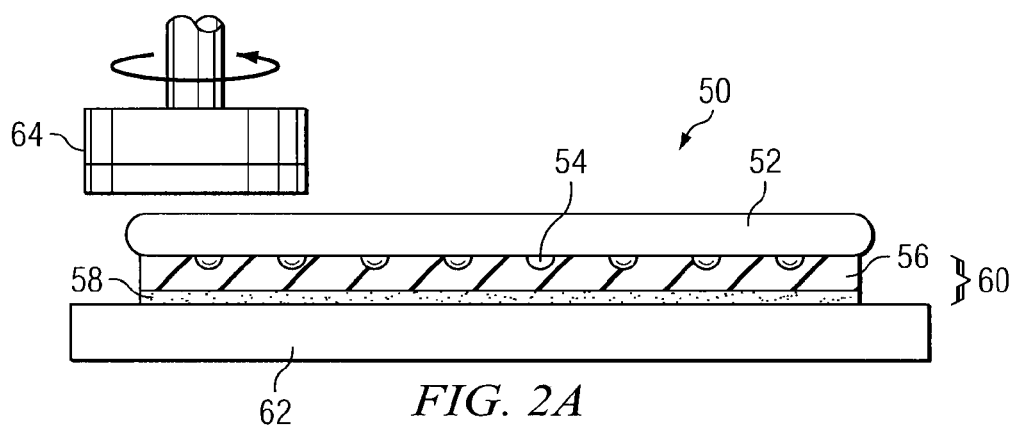
FIG. 2A illustrates a first step in an exemplary method of forming a semiconductor device.

In contrast to the prior art, the present invention incorporates several innovative changes which allow a thinner bumped wafer structure to be formed without sacrificing bump integrity. Turning to FIG. 2A a first step in an exemplary method of forming a semiconductor device, including a bumped wafer structure, is shown. Device 50 includes a bumped wafer 52, having a plurality of bumps 54. The bumps 54 can include such bumps as solder bumps, gold (Au) bumps, or copper (Cu) bumps, for example. An under-film layer 56 is laminated to the bumped wafer 52, so that the bumps 54 are surrounded by the under-film material 56 as shown. An adhesive layer 58 is deposited against the under-film layer 56. Collectively, the under-film layer 56 and adhesive layer 58 comprise a lamination tape 60.

Lamination tape 60 can be deposited by various means known in the art, such as pressing methods. In one embodiment, the under-film layer 56 can be deposited as a coating over the bumped wafer 52, while the adhesive layer 58 is then laminated over the under-film layer 56. Under-film layer 56 can also be deposited using a spin coating or a screen printing method.

In a departure from the prior art, FIG. 2A depicts a support layer 62 which is coupled to the adhesive layer 58. The support layer 62 provides structural support to the bumped wafer structure 52 while a grinder 64 performs a grinding process against the back surface 65 of the bumped wafer 52 as shown. The bumped wafer is configured as shown so that the support layer 62 is located below layers 60.

The support layer 62 can include such materials as glass, acryl board, wafer, or other hard surfaces which are able to be recycled and are structurally capable of supporting the remainder of the device 50. The support layer 62 is removable. Support layer 62 provides structural support during the grinding process. Support layer 62 allows the bumped wafer 52 to be ground more thinly (i.e., less than 100 um). Conventionally, thicknesses of less than 100 um are generally not achievable without the bumped wafer 52 breaking. Bumped wafer 52 can break because conventional tape material, such as lamination tape, is not sufficient to support the bumped wafer 52 during a back grinding process. Breakage in close proximity to a bump 54 area can occur during back grinding, and can also occur once conventional tape material is removed.

In contrast to conventional techniques, by use of a support layer 62, the respective thickness of the bumped wafer can be made much smaller using a back grinding process. Once the grinding process against the back surface 65 of the bumped wafer 52 is completed, the support layer 62 can be removed.

The adhesive layer 58 can include such materials as ultraviolet (UV) tape, thermoplastic resin, photo-resist, or other materials that have adhesive properties. In many cases, UV tape can be implemented to impart peeling convenience.

Figure 2B:
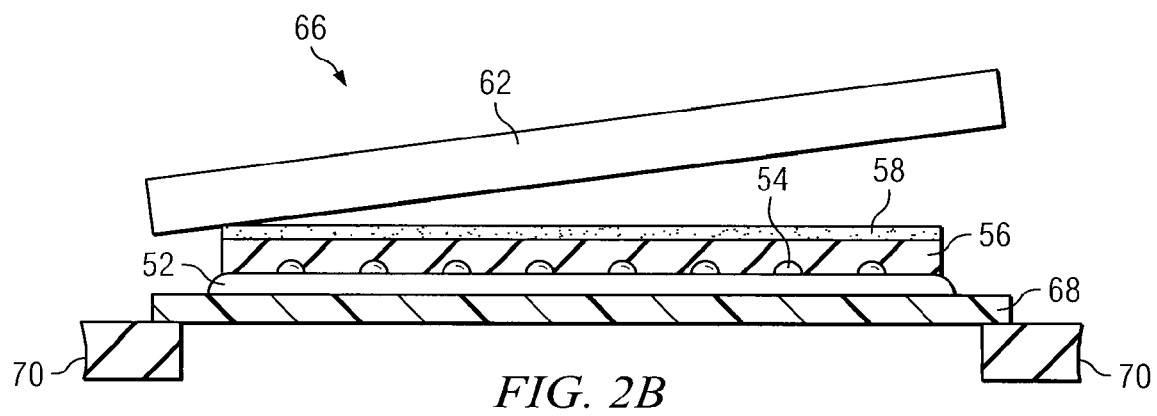
FIG. 2B illustrates a second step in the exemplary method of forming a semiconductor device as shown in FIG. 2A.

FIG. 2B illustrates a second step 66 in the exemplary method of forming a semiconductor device as begun in FIG. 2A. The support layer 62 is shown being removed from the top surface of the adhesive layer 58 following the completion of the grinding process. Device 50 is effectively inverted to place the removable support layer 62 on top of the device structure 66. The layer 62 can then be removed as shown.

A dicing saw tape 68 is laminated to the back surface 65 of the bumped wafer 52. Dicing saw tape 68 can include materials known in the art. Dicing saw tape 68 can support the bumped wafer 52 during a dicing saw process which singulates individual components from the bumped wafer 52. Dicing tape 68 is coupled to a support structure 70 which holds the dicing tape in place during the dicing saw process. Support structure 70 can also include structures and materials which are known in the art. Structure 70 can be compatible with existing tools and manufacturing equipment.

Figure 2C:
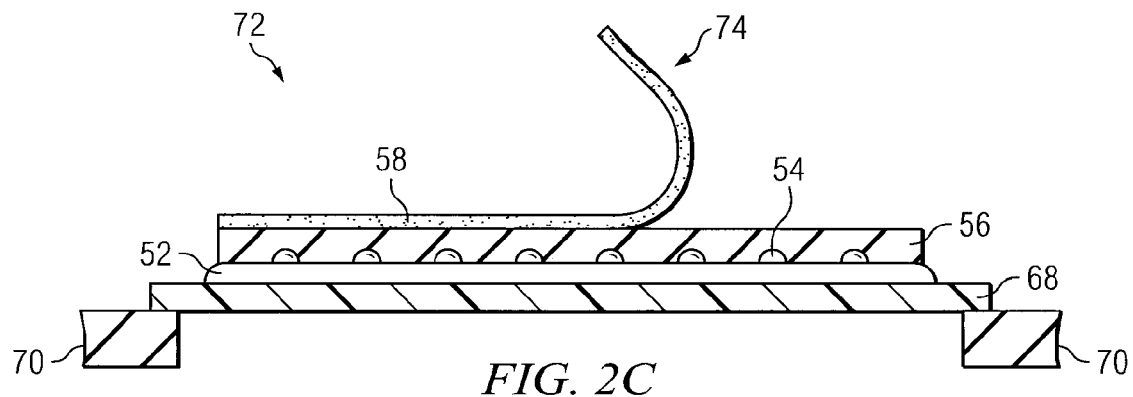
FIG. 2C illustrates a third step in the exemplary method of forming a semiconductor device as shown in FIG. 2A.

FIG. 2C illustrates a third step 72 in the exemplary method begun in FIG. 2A. The adhesive layer 58 is removed 74 from the under-film layer 56 to expose a top surface 57 of the under-film layer 56. Under-film layer 56 can include such materials as epoxy, or acryl materials having adhesive characteristics.

Figure 2D:
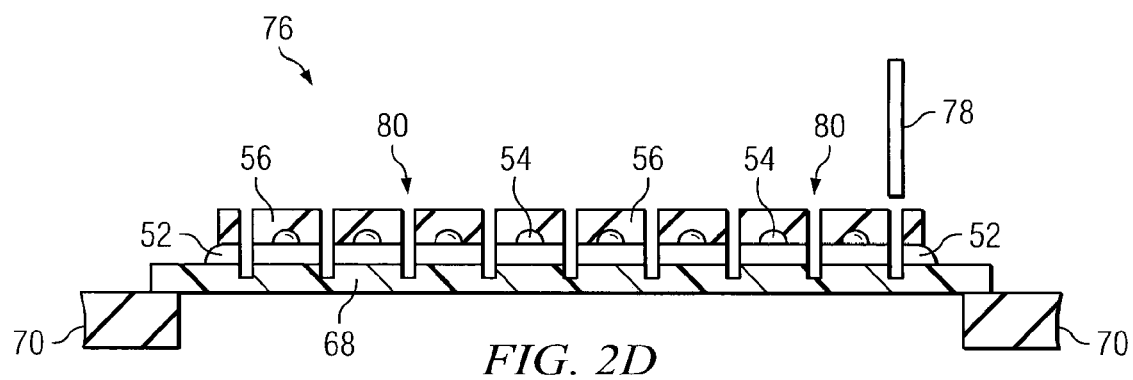
FIG. 2D illustrates a fourth step in the exemplary method of forming a semiconductor device as shown in FIG. 2A.

As a next step, FIG. 2D illustrates the dicing saw process 76 as applied to the bumped wafer 52. A saw 78 singulates the bumped wafer 52, including bumps 54 and under-film material 56, into respective pieces.

Figure 2E:
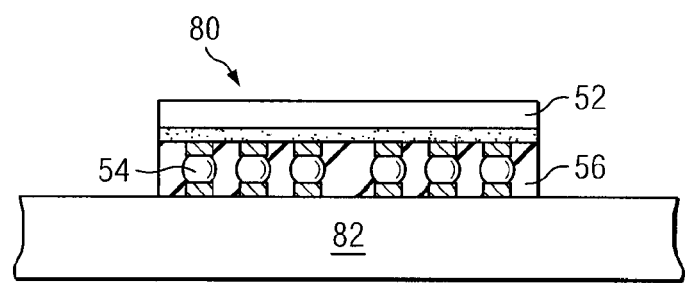
FIG. 2E illustrates a fifth and final step in the exemplary method of forming a semiconductor device as shown in FIG. 2A.

FIG. 2E next illustrates the process 80 of die 82 attachment. A series of conductors 54 such as solder balls 54 electrically couple the die 82 to the bumped wafer 52. The under-film layer effectively can become the underfill material between the die 82 and the bumped wafer 52. As a result, the die 82 attachment process and underfill process can proceed as a single step, which saves manufacturing resources and lowers overall cost.

Under-film layer 56 can vary in thickness to suit a particular application. In some cases, the thickness of layer 56 can be so thick as to cause bumps 54 to be covered prior to a die attachment process as shown in FIG. 2E. However, in those cases, a die 82 can be attached to the bumped wafer 52 using a thermal pressure technique. In other cases, the thickness of layer 56 is such as to expose a portion of the bumps 54.

Figure 3:
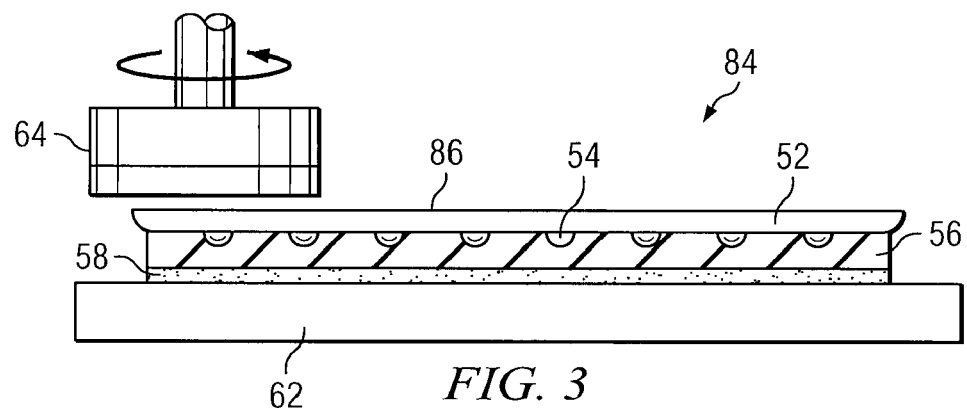
FIG. 3 illustrates the structural support of a bumped wafer through the use of a support layer resulting in a thinner bumped wafer.

FIG. 3 conceptually illustrates the importance of the removable support layer 62 in rendering a thinner bumped wafer 52 from a back grinding process. Again, support layer 62 can include a variety of materials, including glass, ceramic, acryl board, other wafer material, or similar materials. Preferably, the support layer 62 has a high degree of strength and hardness. Additionally, support layer 62 should be smooth throughout, as to impart a level surface for the bumped wafer 52 to reside.

Because support layer 62 is smooth, level, and strong, the physical characteristics of layer 62 plane through to the back surface 86 of bumped wafer 52. The grind wheel 64 is able to remove material from the back surface 86 with a significant degree of precision and accuracy. Because support layer 62 does not flex like a lamination tape would flex under pressure and stress, the grind wheel 64 can remove additional thickness from bumped wafer 52.

The grind wheel 64 removes a consistent amount of material throughout the wafer 52. The back surface 86 of the bumped wafer 52 remains straight and level to a significant degree of precision. No locations of the wafer 52 are substantially thicker than other locations. As a result, a much thinner bumped wafer structure 52 can be achieved than bumped wafers rendered by other conventional methods and techniques. In addition, a technique using a removable support layer 62 as shown results in a consistently repeatable bumped wafer 52 product having high accuracy.

Figure 4A:
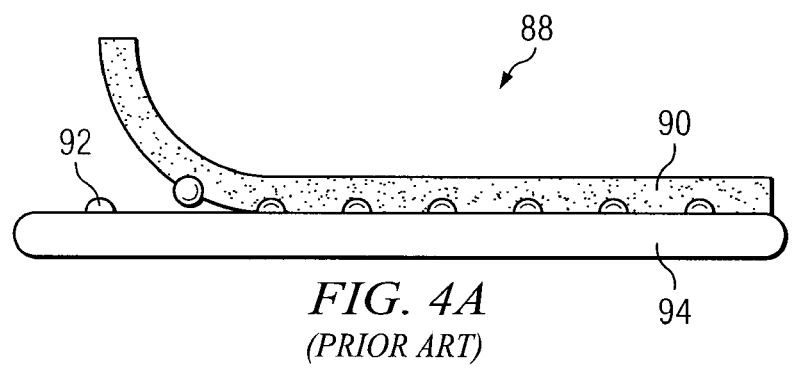
FIG. 4A illustrates a disadvantage of an exemplary prior art method of peeling adhesive tape from a bumped wafer structure.

FIG. 4A illustrates shortcomings of a prior art method 88 of peeling adhesive tape 90 from a bumped wafer 94. As shown, during a tape peeling process, the bumped wafer 94 has a risk of a ball 92 being pulled away from the wafer 94. In addition to the ball 92 being pulled away from the wafer 94, the ball 92 may be damaged and prove to be unworkable, as electrical signals do not flow through the ball 92 to an attached die.

Figure 4B:
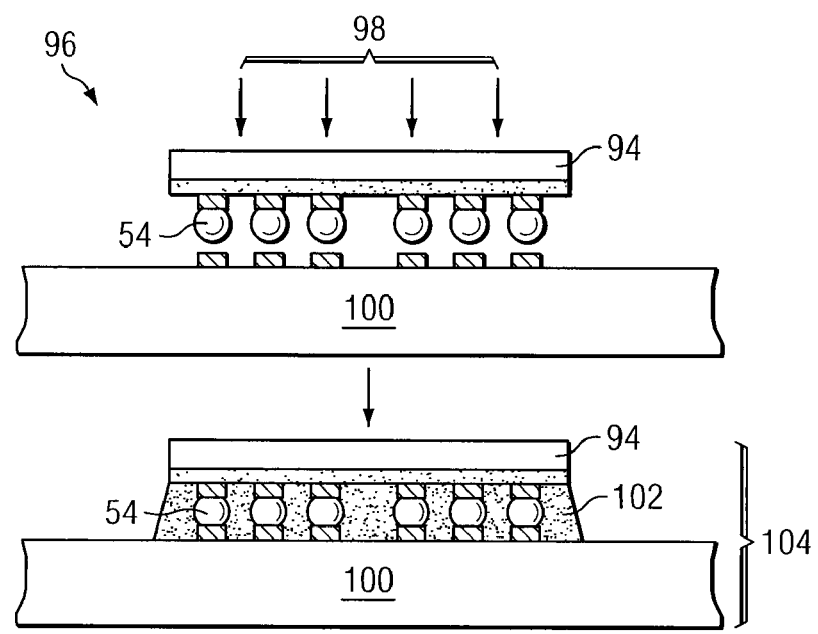
FIG. 4B illustrates a two-step exemplary prior art process of attaching a die to a bumped wafer surface, and then performing an underfill process on the attached die and wafer.

Similarly, FIG. 4B illustrates shortcomings of a prior art method 96 of attaching a die 100 to the wafer 94. In the depicted example, the bumped wafer 94 is pressed (represented by arrows 98) against the die 100 to attach the die 100 to the bumped wafer 94. As a following step, an underfill process is undertaken to deposit an underfill material 102 between the bumped wafer 94 and the die 100 as shown. Conventional methods of underfill deposition include such techniques as a needle dispensing process to deposit the underfill material 102 between the die 100 and the bumped wafer 94.

A two-step process of first attaching a die 100 to a bumped wafer 94, and second, dispensing an underfill material 102 between the die 100 and the bumped wafer 94 requires additional manufacturing resources, such as additional tools and equipment. Further, a two-step process increases fabrication time and reduces productivity.

Figure 5A:
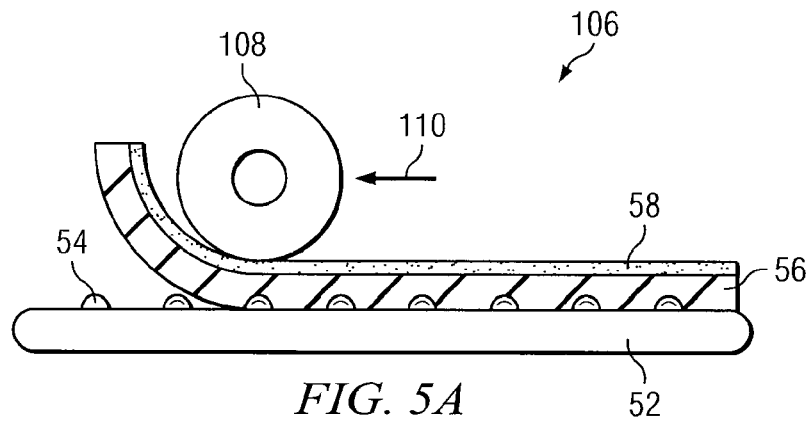
FIG. 5A illustrates an exemplary method of tape lamination to the active surface of a bumped wafer structure.

FIG. 5A illustrates a film lamination process 106, in contrast to the techniques and processes of the prior art. Here again, a bumped wafer structure 52 includes a plurality of bumps 54. An under-film layer 56 and an adhesive layer 58 are collectively laminated over the bumped wafer 52 using a pressing device 108 applying pressure and rotation (denoted by arrow 110) to the layers 56 and 58 to laminate the layers 56 and 58 to the wafer 52. As previously mentioned, the under-film layer 56 can be deposited using a spin coating or screen printing method. The layer 58 can then be laminated over the layer 56.

The under-film layer 56 can be configured to be thinner than conventional underfill materials, partly because the physical characteristics of a thinner bumped wafer 52 make a thinner underfill possible. Bumped wafer 52 is thinner than a conventional bumped wafer structure, and therefore is lighter and exerts less force on the bumps 54 of the bumped wafer 52. As one skilled in the art would expect, however, the various physical characteristics of the under-film layer 56 can be varied to suit a particular application, which can correspond to such factors as die size, gap height, bump 54 density, and fillet size.

Figure 5B:
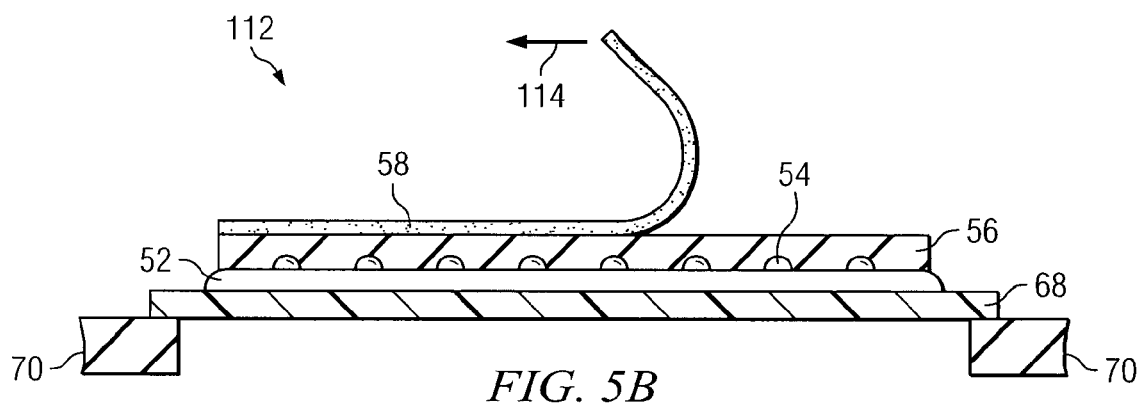
FIG. 5B illustrates an exemplary method of removing an adhesive layer to expose an underfill layer.

FIG. 5B illustrates an adhesive layer removal process 112 in contrast to the methods and techniques of the prior art depicted in FIG. 4A. Once the under-film layer 56 and the adhesive layer 58 are laminated to the wafer 52, the adhesive layer 58 can be removed (denoted by arrow 114) to expose a top surface of the under-film layer and expose the bumps 54 to receive a die in a later fabrication step. In light of FIG. 5B, the under-film layer 56 functions, in part, to protect the bumps 54 from damage. In addition, the layer 56 functions to provide an underfill material, saving the task of providing underfill material in a later step.

Utilizing an under-film layer 56 as underfill material helps to avoid common shortfalls associated with conventional underfill deposition techniques, including traditional requirements of underfill deposition patterns, issues with underfill overflow, and die damage from needles or other application tools.

In addition, use of an under-film layer 56 helps to alleviate common pitfalls seen in conventional underfill techniques and methods. Such pitfalls include random voiding, voids at an exit location, voids in some units, inconsistent underfill flow, inconsistent filleting, and a large dispense tongue or excessive run-out of underfill material.

Figure 5C:
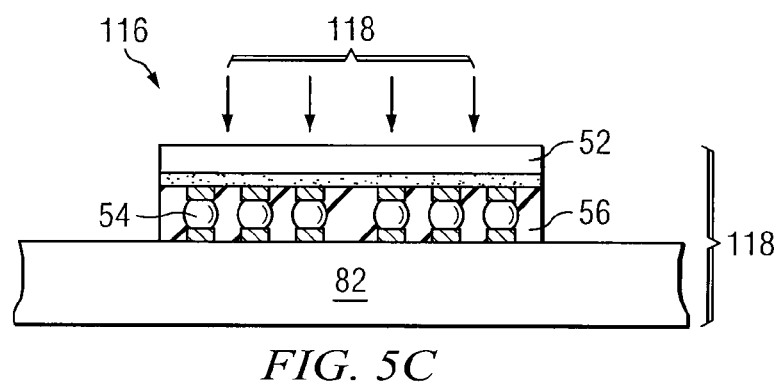
FIG. 5C illustrates a one-step die attaching and underfill process performed to a connected bumped wafer structure/die.

FIG. 5C illustrates a one-step process 116 of die attachment and underfill deposition, in contrast to the two-step, prior art method depicted in FIG. 4B. A bumped wafer structure 52 is joined to the die 82 using pressure (denoted by arrows 118). The under-film layer 56, which was laminated over the active surface of the bumped wafer 52 in a previous step, now serves as underfill material between the bumped wafer structure 52 and the die 82 as shown for the completed package 118. Because the under-film layer is preexisting, die 82 attachment and underfill deposition can proceed in a single step.

In addition, conventional underfill material can leave voids or gaps, which can impact device performance and structural stability. The use of under-film layer 56 helps to alleviate the formation of voids, and improves overall device stability and performance.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a wafer having a plurality of bumps formed on a surface of the wafer;
   forming an under-film layer over the bumps formed on the surface of the wafer to completely cover all portions of the bumps with the under-film layer;
   after forming the under-film layer, forming an adhesive layer over the under-film layer;
   after forming the adhesive layer, attaching a support layer over the adhesive layer;
   grinding a back surface of the wafer, wherein the support layer provides structural support to the wafer during the grinding process;
   following the grinding process, laminating a dicing saw tape to the back surface of the wafer;
   removing the support layer to expose the adhesive layer which remains disposed over the under-film layer; and
   after removing the support layer, removing the adhesive layer to expose the under-film layer, wherein all portions of the bumps remain completely covered by the under-film layer after removing the adhesive layer.

2. The method of claim 1, further comprising removing the dicing saw tape to singulate each of the plurality of semiconductor die.

3. The method of claim 1, wherein grinding the back surface of the wafer removes between zero (0) and two (2) mils of material from the back surface of the wafer.

4. The method of claim 1, wherein the adhesive layer comprises an ultraviolet (UV) tape.

5. The method of claim 1, wherein the support layer comprises glass.

6. A method of making a semiconductor device, comprising:
   forming an under-film layer over bumps formed on a surface of a wafer to completely cover all portions of the bumps with the under-film layer;
   after forming the under-film layer, forming an adhesive layer over the under-film layer;
   after forming the adhesive layer, attaching a support layer containing glass, acryl board, or wafer material over the adhesive layer;
   removing a portion of a back surface of the wafer;
   removing the support layer to expose the adhesive layer;
   after removing the support layer, removing the adhesive layer to expose the under-film layer while all portions of the bumps remain completely covered by the under-film layer after removing the adhesive layer;
   singulating the wafer to form a semiconductor die; and
   using the under-film layer as an underfill between the semiconductor die and a substrate when mounting the semiconductor die to the substrate.

7. The method of claim 6, further comprising applying dicing tape to the back surface of the wafer after removing the portion of the back surface of the wafer.

8. The method of claim 6, further comprising removing up to two mils of the back surface of the wafer.

9. The method of claim 6, wherein the adhesive layer comprises a thermoplastic resin.

10. The method of claim 6, wherein the under-film layer comprises an epoxy material.

11. The method of claim 6, further comprising forming the under-film layer by spin coating or screen printing.

12. A method of making a semiconductor device, comprising:
   forming an under-film layer over bumps disposed on a surface of a wafer to completely cover the bumps;
   forming an adhesive layer over the under-film layer;
   attaching a support layer over the adhesive layer;
   removing a portion of a back surface of the wafer;
   removing the support layer to expose the adhesive layer which remains disposed over the under-film layer;
   removing the adhesive layer to expose the under-film layer while the bumps remain completely covered by the under-film layer;
   singulating the wafer to form a semiconductor die; and
   pressing the bumps into contact with a substrate while the under-film layer provides an underfill between the semiconductor die and the substrate.

13. The method of claim 12, further comprising applying dicing tape to the back surface of the wafer after removing the portion of the back surface of the wafer.

14. The method of claim 12, further comprising removing up to two mils of the back surface of the wafer.

15. The method of claim 12, wherein the support layer comprises an acryl board material.

16. The method of claim 12, wherein the adhesive layer comprises a photo-resist material.

17. The method of claim 12, wherein the under-film layer comprises an acryl adhesive material.

* * * * *